US010312190B2

(12) United States Patent
Huang et al.

(10) Patent No.: US 10,312,190 B2
(45) Date of Patent: Jun. 4, 2019

(54) STRUCTURE OF INTEGRATED INDUCTOR

(71) Applicant: REALTEK SEMICONDUCTOR CORPORATION, Hsinchu (TW)

(72) Inventors: Kai-Yi Huang, Taipei (TW); Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 621 days.

(21) Appl. No.: 14/727,139

(22) Filed: Jun. 1, 2015

(65) Prior Publication Data

US 2016/0035671 A1 Feb. 4, 2016

(30) Foreign Application Priority Data

Jul. 30, 2014 (TW) .............................. 103126057 A

(51) Int. Cl.
*H01F 17/00* (2006.01)
*H01L 23/522* (2006.01)

(52) U.S. Cl.
CPC ..... *H01L 23/5227* (2013.01); *H01F 17/0006* (2013.01); *H01F 17/0013* (2013.01); *H01L 2924/0002* (2013.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | | |
|---|---|---|---|---|
| 6,635,949 B2* | 10/2003 | Lowther | ............. | H01F 17/0013 257/277 |
| 7,084,481 B2 | 8/2006 | Lowther et al. | | |
| 7,761,078 B2 | 7/2010 | Bhagat et al. | | |
| 8,219,060 B2* | 7/2012 | Bhagat | ................ | H01F 17/0006 336/200 |
| 2002/0067235 A1 | 6/2002 | Ueda et al. | | |
| 2007/0296519 A1* | 12/2007 | Ezzeddine | .............. | H01P 5/185 333/131 |

(Continued)

FOREIGN PATENT DOCUMENTS

| | | |
|---|---|---|
| CN | 1350310 | 5/2002 |
| CN | 101496294 A | 7/2009 |

(Continued)

OTHER PUBLICATIONS

Office Action of the counterpart TW application No. 103126057 dated Jun. 1, 2016.

(Continued)

*Primary Examiner* — Tszfung J Chan
(74) *Attorney, Agent, or Firm* — WPAT, PC

(57) ABSTRACT

This invention discloses an integrated inductor structure, including a first metal trace, a second metal trace, and a connecting metal trace. Tow terminals of the connecting metal trace are respectively connected to the first metal trace and the second metal trace through at least a connecting structure. The connected first metal trace, the connecting metal trace and the second metal trace together form an inductor structure. The connecting structure is connected to a connecting area of the first metal trace. The connecting area of the first metal trace has a first width. A smallest width of the first metal trace is a second width. The second width is smaller than the first width.

9 Claims, 14 Drawing Sheets

(56) References Cited

U.S. PATENT DOCUMENTS

2009/0167476 A1* 7/2009 Lee .................... H01F 17/0006
 336/200
2012/0056680 A1 3/2012 Kim et al.
2014/0042612 A1* 2/2014 Liu .................. H01L 21/76807
 257/734

FOREIGN PATENT DOCUMENTS

TW 200929279 7/2009
TW 201135803 10/2011

OTHER PUBLICATIONS

Search report of the counterpart TW application No. 103126057 dated Jun. 1, 2016.
English abstract translation of the Office Action of the counterpart TW application No. 103126057 dated Jun. 1, 2016.
Office Action of the counterpart TW application No. 103126057 dated Feb. 8, 2017 . . . .
English abstract translation of the Office Action of the counterpart TW application No. 103126057 dated Feb. 8, 2017 . . . .
Search report of the counterpart TW application No. 103126057 dated Feb. 8, 2017 . . . .
Office action from Taiwan patent office for counterpart application 103126057 dated May 4, 2017.
CN Publication No. CN101496294A, its US counterpart is U.S. Pat. No. 7,761,078.
Ali M. Niknejad et al., Design, Simulation and Applications of Inductors and Transformers for Si RF ICs, Kluwer Academic Publishers Group, Norwell, Massachusetts, 2000, pp. 22-27.
Jose M. Lopez et al., "Improvement of the quality factor of RF integrated inductors by layout optimization", IEEE Transactions on Microwave Theory and Techniques, vol. 48, No. 1, Jan. 2000.
Taiwan Patent Office Action for Patent No. 103126057.

* cited by examiner

STRUCTURE OF INTEGRATED INDUCTOR

BACKGROUND

1. Field of the Disclosure

This invention relates to integrated inductor structures, especially to highly compact integrated inductor structures.

2. Description of Related Art

Due to manufacturing restrictions, on-chip inductors are often in the design of planner structures. FIG. 1 illustrates a prior-art planner spiral inductor. The planner spiral inductor 100 includes a spiral first metal trace 110 (light color), and a second metal trace 120 (dark color). The first metal trace 110 and the second metal trace 120 are deployed in different layers of a semiconductor structure. In FIG. 1 the first metal trace 110 is above the second metal trace 120, but it is also possible that the first metal trace 110 is under the second metal trace 120. The first metal trace 110 and the second metal trace 120 are connected through a connecting structure 130. The first metal trace 110 includes a coil of 3 turns. When there is a need to increase the inductance of the planner spiral inductor 100, the number of turns of the coil of the first metal trace 110 must be increased. The increase in the number of turns not only causes an increase in the area of the planner spiral inductor 100, but also causes an increase in the parasitic series resistance and the parasitic capacitance of the planner spiral inductor 100, which in turn causes the self-resonant frequency and the quality factor Q of the planner spiral inductor 100 to decrease. In addition, metal loss and substrate loss are also key factors to the quality factor Q. The metal loss is caused by the resistance of the metal itself. The substrate loss arises from two reasons. One is that when the inductor operates, a time-varying electric displacement happens between a metal coil of the inductor and a substrate, which cause a displacement current between the metal coil and the substrate. When the displacement current penetrates into the low resistance substrate, energy losses occur. The displacement current is related to an area of the coil, the larger the area, the greater the displacement current. The other reason is that a time-varying electromagnetic field of the inductor penetrates a dielectric layer, which causes a magnetically induced eddy current on the substrate. Energy losses occur due to the opposite directions of the induced current and the current of the inductor.

When an inductor operates in low frequencies, the current distributes evenly in the metal coil and the metal loss at the time is from the series resistance in the metal coil. When the inductor operates in high frequencies, greater magnetic fields are induced at inner turns of the metal coil than at outer turns. Intense magnetic fields induce eddy currents at inner turns of the metal coil. The eddy currents causes uneven distribution of currents, most currents being pushed to the surface of the metal coil, which is known as a skin effect. Under the skin effect, the cross section of the metal through which the current flows becomes smaller, and hence the current experiences a larger resistance, which results in a decreased quality factor Q. FIG. 2 shows another prior-art planner spiral inductor. This tapered spiral inductor alleviates the skin effect since the inner turns of the metal coil of the inductor suffer the most severe skin effect. Further, the tapered spiral structure reduces the area of the inductor and decreases the parasitic capacitance so the quality factor Q and the self-resonant frequency of the inductor can be improved. Because of its asymmetric structure, a position of the inductor's center tap is hard to decide. Moreover, the positions of an inductive center, a capacitive center, and a resistive center of this spiral inductor are different from one another, which makes this spiral inductor improper for passive components in a differential circuit.

To address the problem, a symmetric spiral inductor is introduced. FIG. 3 shows a structure of a prior-art symmetric spiral inductor. The symmetric spiral inductor 300 includes a plurality of metal traces 310 (310a~310d), a plurality of connecting traces 320 (320a~320c), and a plurality of connecting structures 330. A connecting trace 320 is also referred to as a bridge. All the metal traces 310a~310d are deployed on the same layer of a semiconductor structure (light color), and all the connecting traces 320a~320c are made of metal and are deployed on a different layer (dark color) from the metal traces 310a~310d. As an example, the connecting traces 320a~320c are deployed under the metal traces 310a~310d in FIG. 3.

The connecting traces 320 are to connect different metal traces 310. For example, the connecting trace 320a connects the metal trace 310a and the metal trace 310b, the connecting trace 320b connects the metal trace 310b and the metal trace 310c, and the connecting trace 320c connects the metal trace 310c and the metal trace 310d. The two ends of a connecting trace 320 connect the metal traces 310 through the connecting structures 330. The connecting structure 330 can be a via structure of a semiconductor manufacturing process that connects components at different layers. It is easy to find the position of the center tap of the symmetric spiral inductor 300 for its symmetric structure; however the connecting traces 320 are frequently used. When an inductor with large inductance is required, the turns of the symmetric spiral inductor 300 must be increased, which in turn increases the number of the connecting traces 320. If the sheet resistance of the connecting trace 320 is larger than that of the metal trace 310, then the quality factor Q of the symmetric spiral inductor 300 is dominated by the resistance of the connecting traces 320 and the parasitic resistance of the connecting structures 330.

FIGS. 4A and 4B illustrate a structure of another prior-art symmetric spiral inductor and its partial enlargement. The symmetric spiral inductor 400 includes a plurality of metal traces 410 (410a~410d), a plurality of connecting traces 420 (420a~420c), and a plurality of connecting structures 430. Similar to FIG. 3, the metal traces 410 are connected by the connecting traces 420. The two ends of a connecting trace 420 connect the metal traces 410 through a connecting structure 430, respectively. In contrast to the structure in FIG. 3 which is rectangular, the structure of the inductor in FIG. 4 is octagonal and therefore has better inductive effects. FIG. 4B shows a partial enlargement (corresponding to the area enclosed by a dotted line in FIG. 4A) of the symmetric spiral inductor 400. Generally a cross section of the connecting structure 430 is designed to be a rectangle. Due to restrictions of the IC design rule, the width of the connecting structure 430 must be greater than D, and a distance to the edge of the metal trace 410b must be greater than h. In other words, if the width of the connecting structure 430 is designed to be D, the width W of a connecting area 440 (depicted by stripped lines) of the metal trace 410b through which the connecting structure 430 connects the metal trace 410b must be greater than D+2h. For example, if D is 3 µm and h is 0.5 µm, then W must be greater than 4 µm. Likewise, the connecting trace 420b has a connecting area on the corresponding position through which the connecting structure 430 connects the connecting trace 420b, and the width of this connecting area must be greater than W as well. In general, the width of the connecting trace 420b is designed to be W. Because the widths of the metal traces 410 and the connecting traces 420 of the symmetric spiral inductor 400 are designed to be W, the flexibility of designing the entire area of the symmetric spiral inductor 400 is restricted; in particular, when the turns of the symmetric spiral inductor 400 are increased to enhance the inductance, the increase in the entire area of the inductor causes an increase in the parasitic capacitance and a decrease in the self-resonant frequency.

SUMMARY

In consideration of the imperfections of the prior art, an object of the present disclosure is to provide integrated inductor structures, so as to make an improvement to the prior art.

The present invention discloses an integrated inductor structure, comprising: a first metal trace; a second metal trace; and a connecting metal trace with its two ends respectively connecting the first metal trace and the second metal trace through at least a connecting structure. The connected first metal trace, the connecting metal trace, and the second metal trace form an inductor structure. The connecting structure connects a connecting area of the first trace, and the connecting area of the first metal trace has a first width. A smallest width of the first metal trace, except for the connecting area, is a second width, and the second width is smaller than the first width.

The present invention also discloses an integrated inductor structure, comprising: a first metal trace; a second metal trace; and a connecting metal trace, for connecting the first metal trace and the second metal trace through a connecting structure. The connected first metal trace, the connecting metal trace, and the second metal trace form an inductor structure. The connecting structure connects a connecting area of the connecting metal trace, and the connecting area of the connecting metal trace has a first width. A smallest width of the connecting metal trace, except for the connecting area, is a second width, and the second width is larger than the first width.

An integrated inductor structure of the present invention reduces the inductor's overall area by reducing the widths of metal lines to decrease the parasitic capacitance. In comparison with the prior art, for a given inductance, the integrated inductor structure of the present invention has improved self-resonant frequency and quality factor Q. The integrated inductor of the present invention provides better quality factor Q and more stable inductance than the prior-art inductor when operating at the same frequency.

These and other objectives of the present disclosure will no doubt become obvious to those of ordinary skill in the art after reading the following detailed description of the embodiments that are illustrated in the various figures and drawings.

DETAILED DESCRIPTION OF THE EMBODIMENTS

The following description is written by referring to terms of this technology field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. Integrated inductor structures are disclosed, and the detail known in this field will be omitted if such detail has little to do with the features of the present disclosure. People of ordinary skill in the art can choose components or steps equivalent to those described in this specification to carry out the present disclosure, which means that the scope of this disclosure is not limited to the embodiments in the specification.

Figure 1:
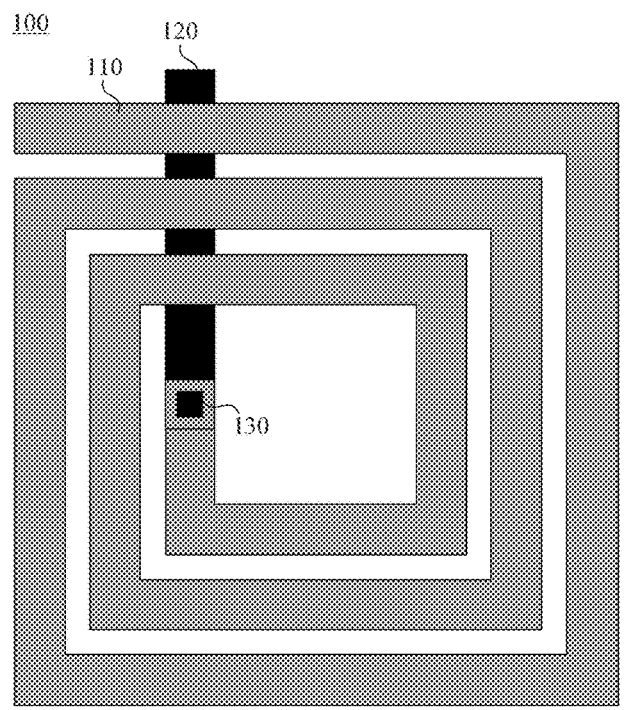
FIG. 1 illustrates a prior-art planner spiral inductor.
Figure 2:
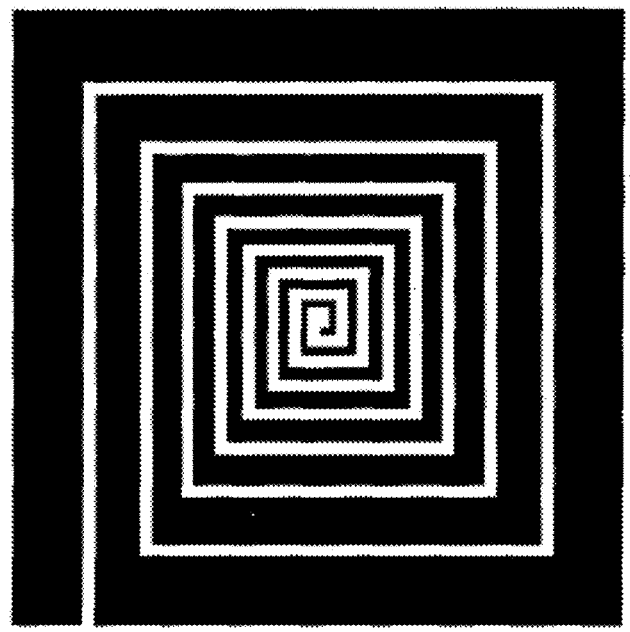
FIG. 2 illustrates another prior-art planner spiral inductor.
Figure 3:
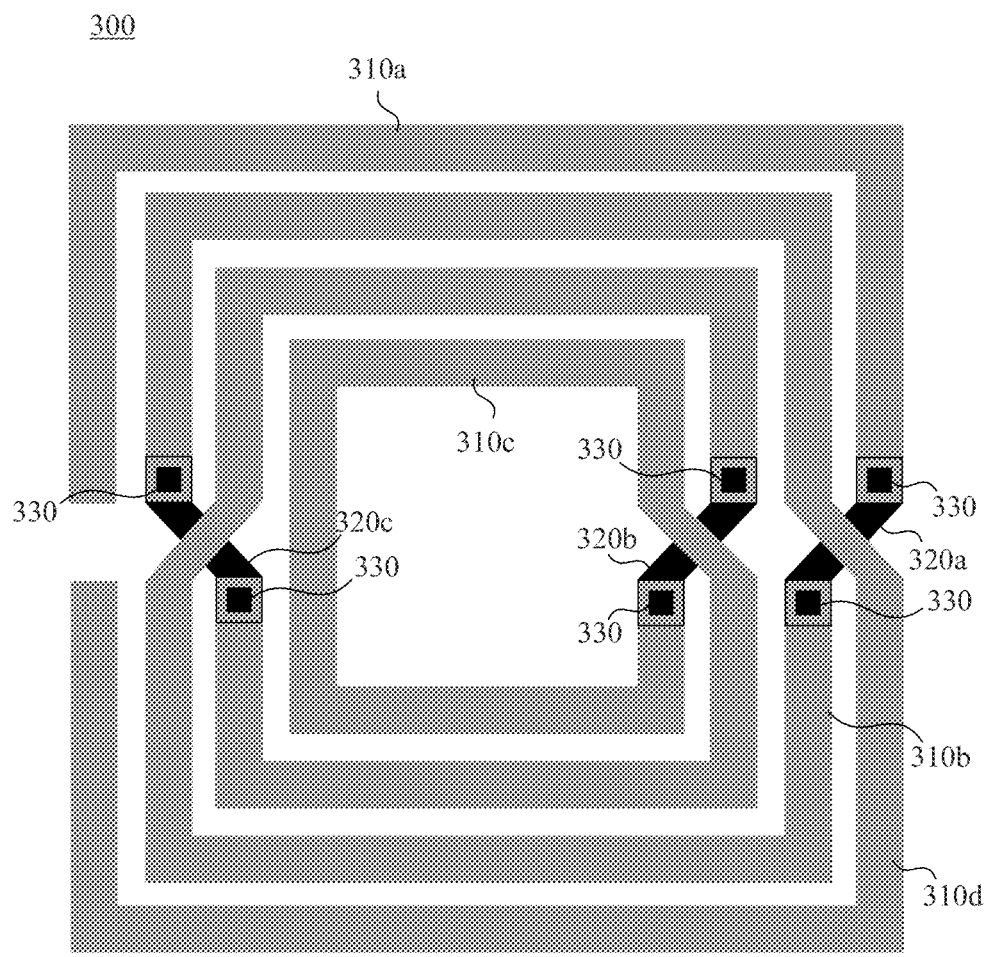
FIG. 3 illustrates a structure of a prior-art symmetric spiral inductor.
Figure 4A:
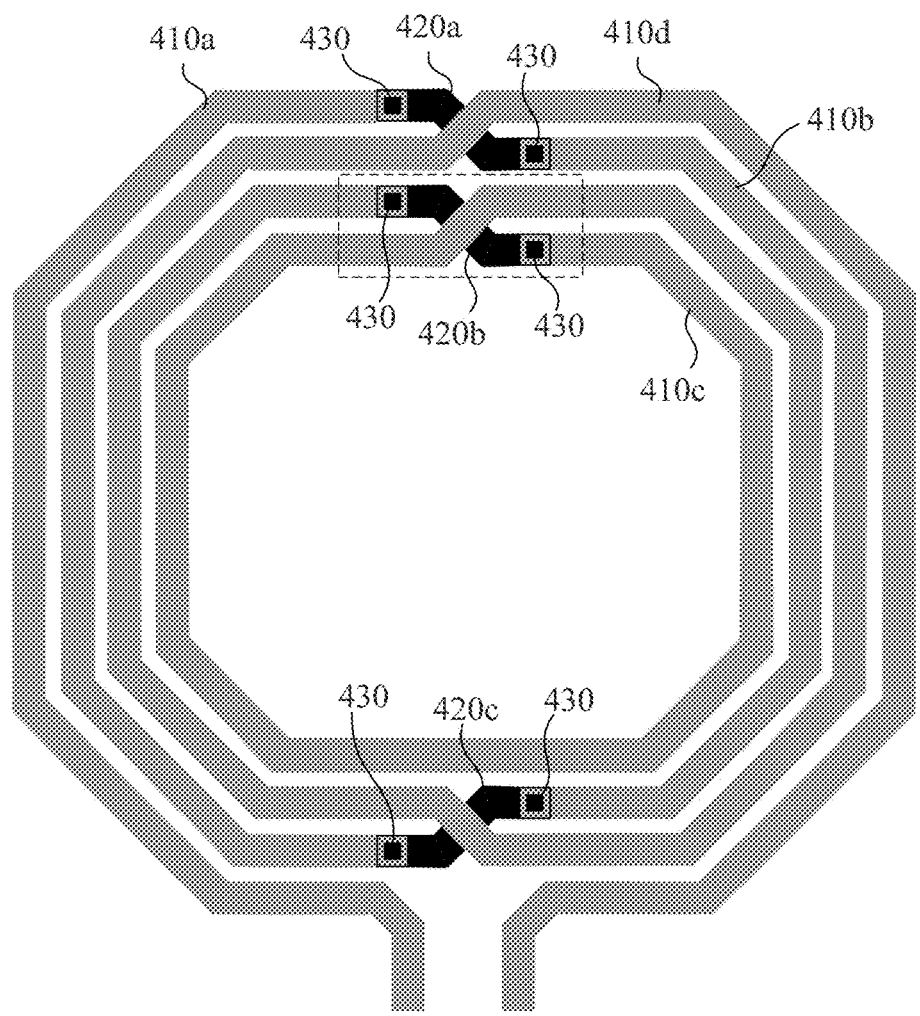
FIGS. 4A and 4B illustrate a structure of another prior-art symmetric spiral inductor and its partial enlargement.
Figure 4B:
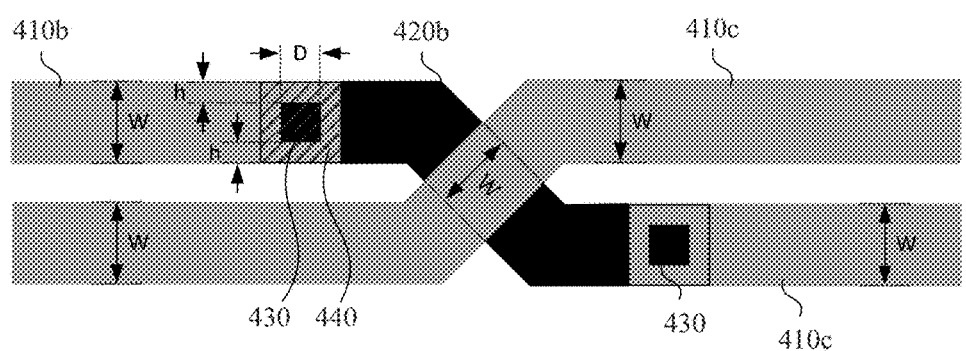
Figure 5A:
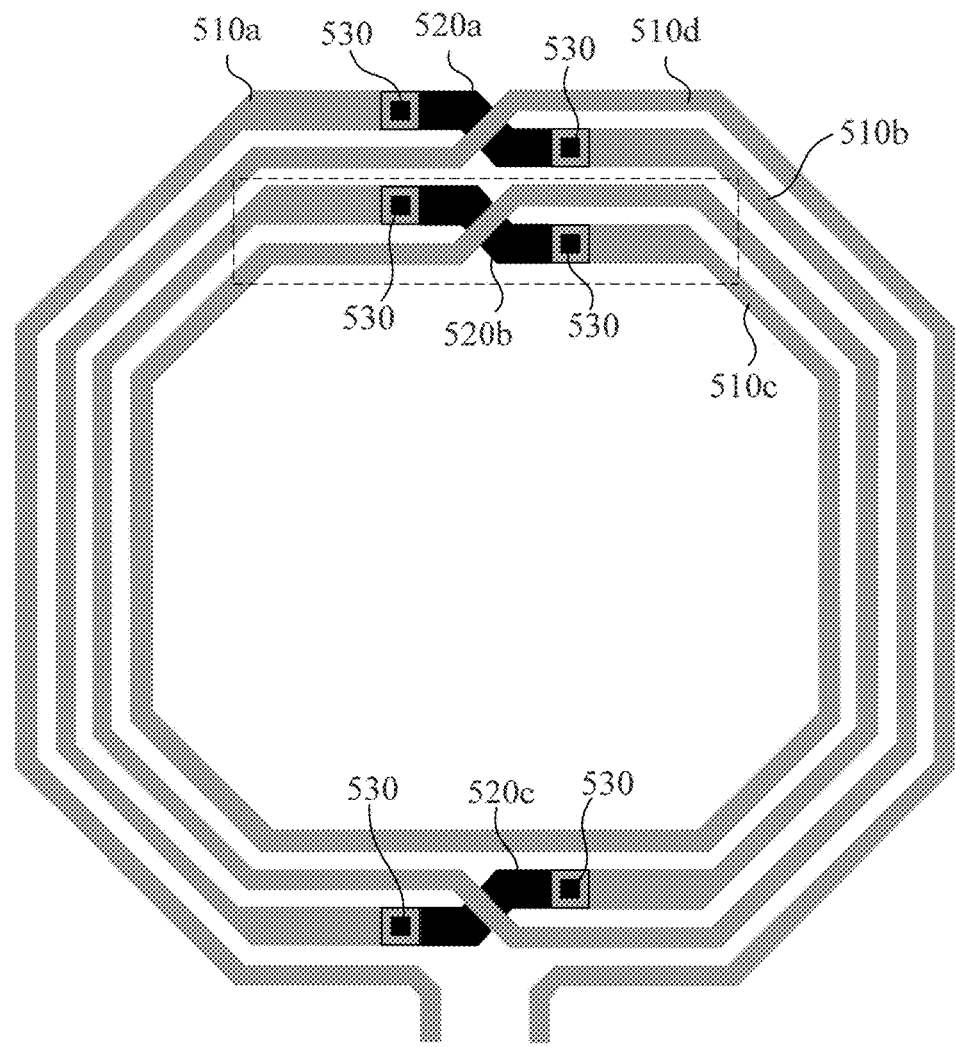
FIGS. 5A to 5D illustrate a structure of a symmetric spiral inductor and its partial enlargements according to an embodiment of the present invention.
Figure 5B:
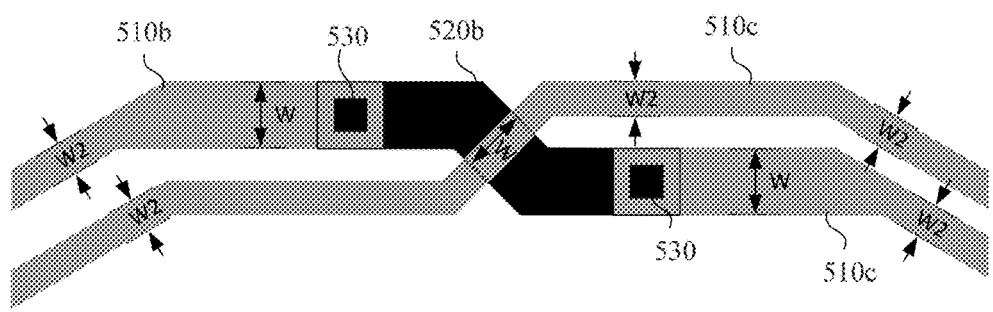
Figure 5C:
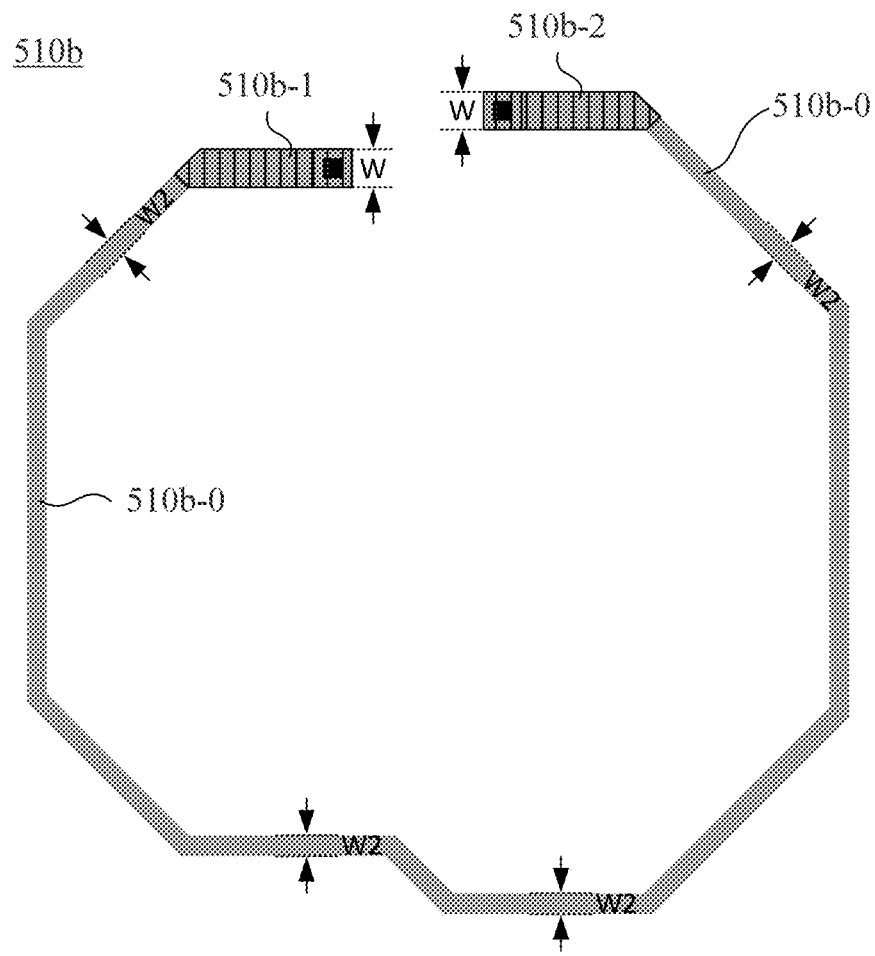
Figure 5D:
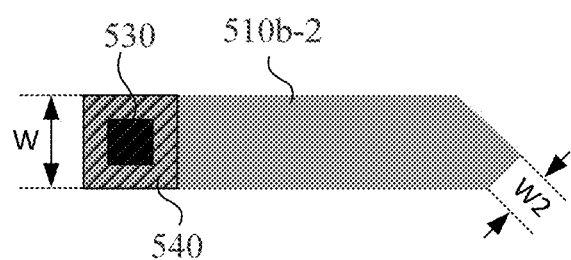
Figure 6A:
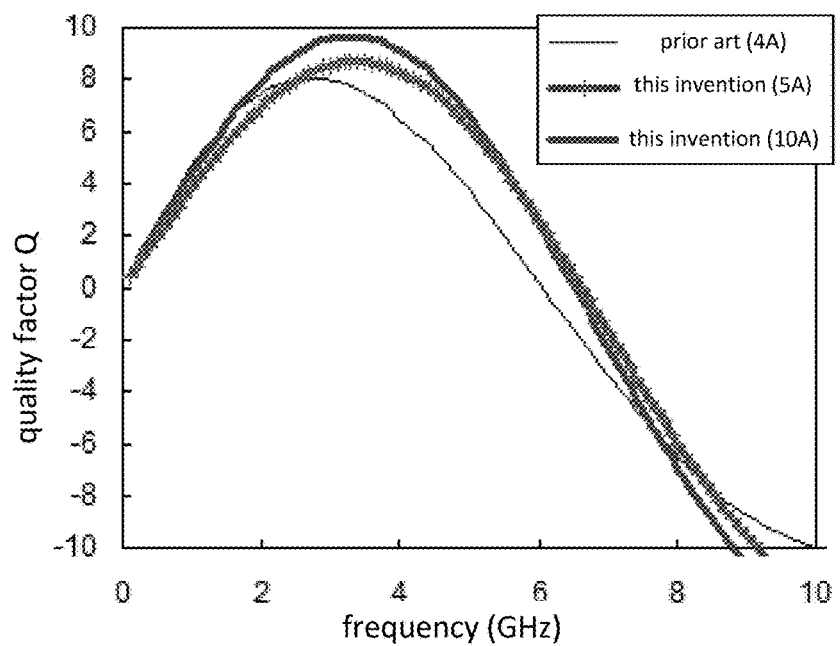
FIGS. 6A and 6B illustrate relationships of the quality factor Q and the inductance with respect to the frequency of the presently disclosed integrated inductor and the prior-art integrated inductor.
Figure 6B:
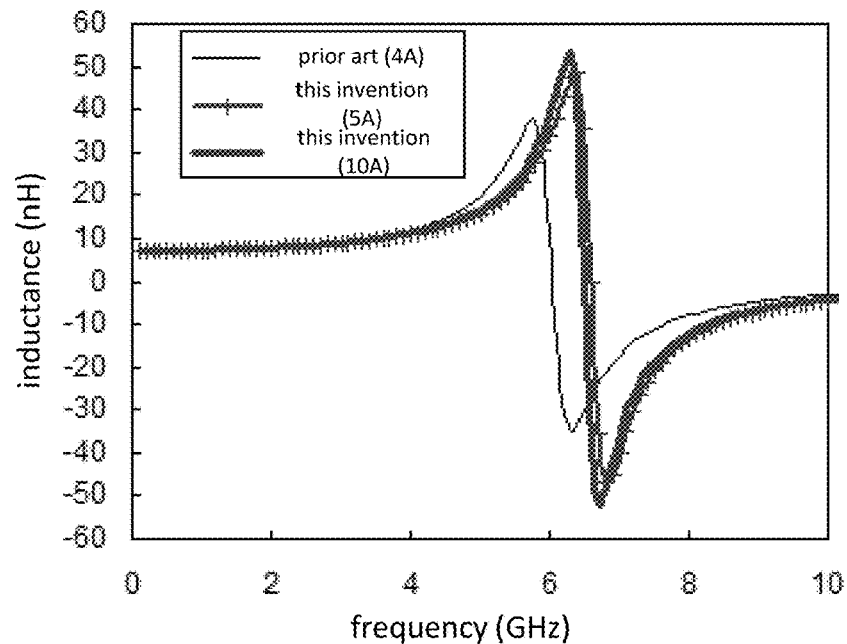

Referring to FIG. 4B again, according to the IC design rule, the smallest widths of the metal trace 410b and the metal trace 410c (except for the connecting areas 440) can be smaller than D+2h. For example, if D+2h is 4 μm, the smallest width can be designed to be smaller than 4 μm, but there is still a minimum width of manufacturing restriction, such as 2 μm. FIGS. 5A, 5B, 5C, and 5D show a structure of a symmetric spiral inductor and its partial enlargements according to an embodiment of the present invention. The symmetric spiral inductor 500 includes a plurality of metal traces 510 (510a~510d), a plurality of connecting traces 520 (520a~20c), and a plurality of connecting structures 530. The connecting trace 520 is made of metal. FIG. 5B shows an enlargement of the area enclosed by the dotted line in FIG. 5A. Taking the metal trace 510b and the metal trace 510c in FIG. 5B for example (the same design being applicable to the metal traces 510a and 510d), in this embodiment, the connecting parts (i.e., the connecting area of the metal trace 510), where the metal trace 510b and the metal trace 510c are connected to the connecting structure 530, and the traces connecting thereto are designed to be the minimum width W (e.g., 4 μm) for connecting areas permitted by the IC design rule, and other parts are designed to have a width of W2, which is smaller than W. The smallest value of W2 can be as small as the minimum width permitted by the IC design rule (e.g., 2 μm). In another embodiment, the smallest widths of the metal trace 510b and the metal trace 510c can be different; for example, the smallest width of the metal trace 510b is Wb whereas the smallest width of the metal trace 510c is We (Wb≠Wc). The area of the inductor can be reduced as long as one of them is smaller than W and the other is not greater than W. FIG. 5C shows a structure of the metal trace 510b. The metal trace 510b includes a first segment 510b-0 (plain region), a second segment 510b-1, and a third segment 510b-2. In one embodiment, the first segment 510b-0 has a uniform width W2; in other embodiments, however, the width of the first segment 510b-0 can be inconsistent. As long as the segment 510b-0 has a partial segment whose width is smaller than W, the entire area of the inductor can be reduced. Referring to FIG. 5D, the region that connects the third segment 510b-2 and the first segment 510b-0 has a width of W2 and the third segment 510b-2 includes the connecting area 540 (stripped region). The second segment 510b-1 has the same characteristics. The connecting area 540 is connected to the connecting structure 530 and has a width of W. The second segment 510b-1 and the third segment 510b-2 are extensions of the first segment 510b-0, and the width increases gradually from W2 to W. Likewise, in FIG. 5A, the metal trace 510a, the metal trace 510c, and the metal trace 510d also have segments of different widths. The metal trace 510a, the metal trace 510b, the metal trace 510c, and the metal trace 510d have a wider width at their individual connecting region (i.e., the connecting area 540) that is connected to the connecting structure 530, and have a width in other parts, which is smaller than W and can be consistent or not. The width W can be, for example, a minimum width for connecting areas permitted by the IC design rule. If W is 4 μm and W2 is 2 μm, the symmetric spiral inductor 500 in FIG. 5A saves about 30% area compared to the symmetric spiral inductor 400 in FIG. 4A. An integrated inductor with a smaller area helps reduce the parasitic capacitance so the quality factor Q and the self-resonant frequency can be improved, which increases the range the inductor's operating frequency. FIGS. 6A and 6B show relationships of the quality factor Q and the inductance with respect to the frequency of the presently disclosed integrated inductor and the prior-art integrated inductor. The peak value of the quality factor Q of the present invention (around 8.5) is larger than that of the prior-art integrated inductor (around 7.8), and the self-resonant frequency of the present invention is higher than that of the prior-art integrated inductor. Thus, the range of the operating frequency of the integrated inductor of the present invention is increased. In addition, when the integrated inductor operates around the peak value of the quality factor Q, the variation in inductance with respect to the frequency is relatively small so a stable inductance can be obtained.

Figure 7A:
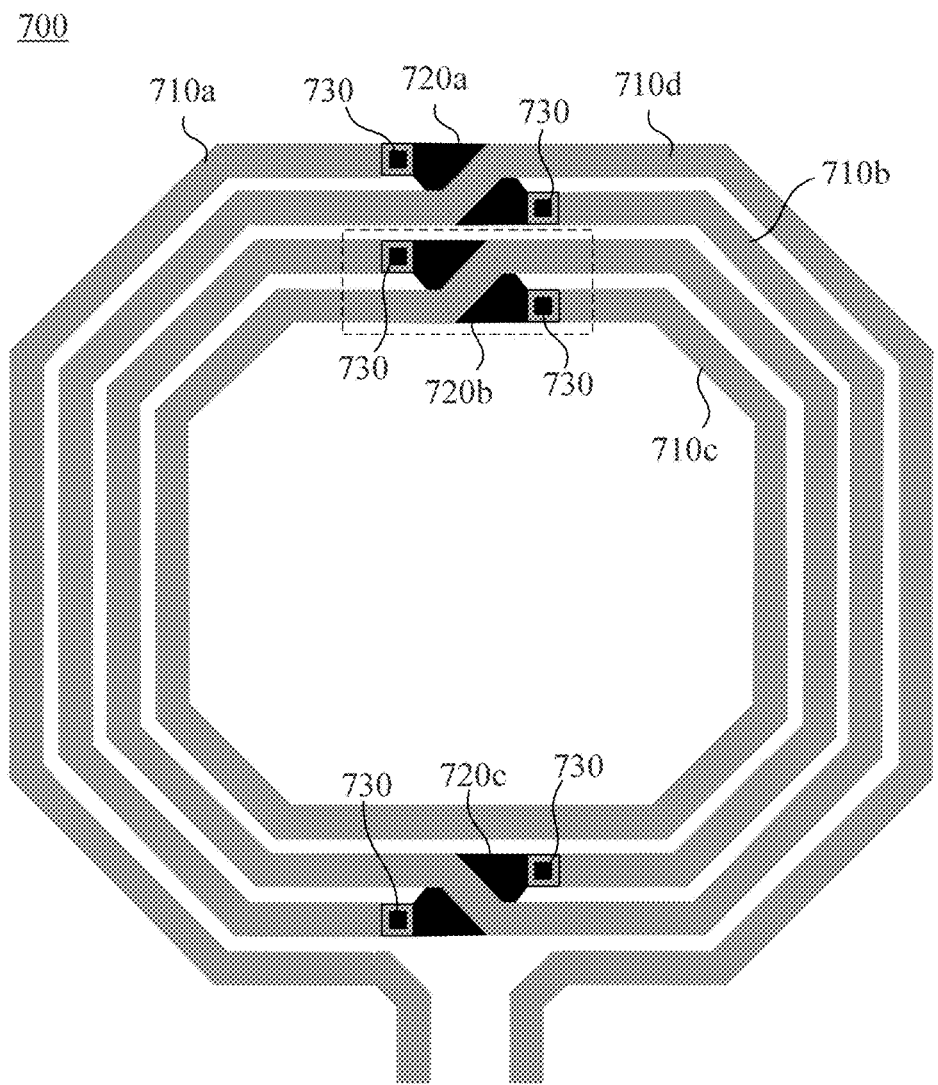
FIGS. 7A and 7B illustrate a structure of a symmetric spiral inductor and its partial enlargement according to another embodiment of the present invention.
Figure 7B:
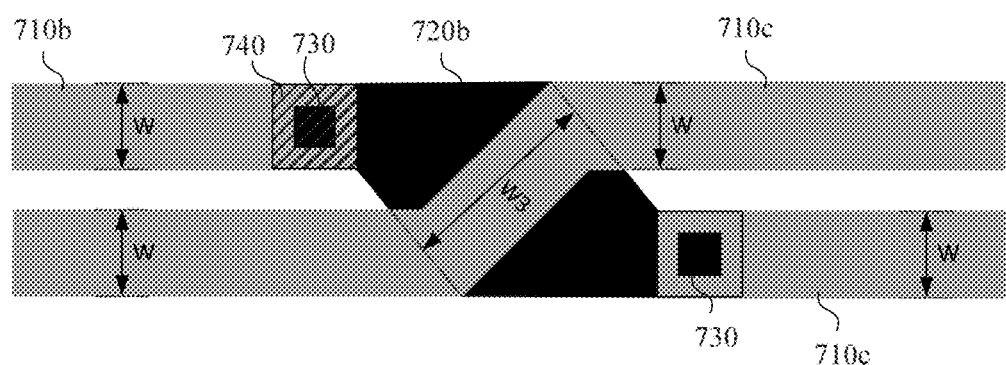
Figure 8A:
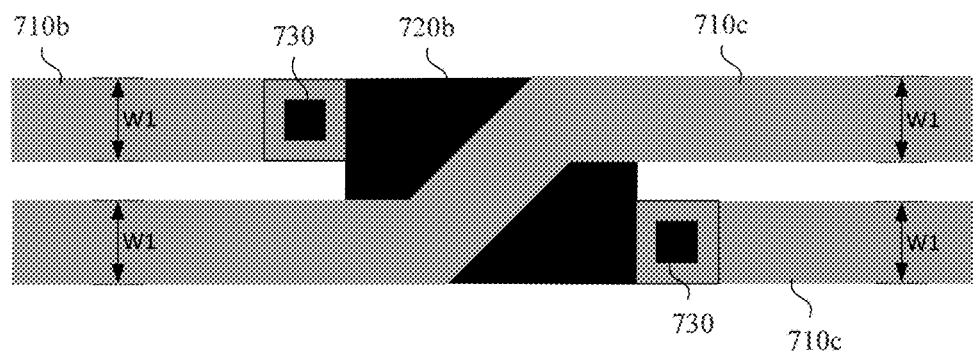
FIGS. 8A and 8B illustrate structures of the connecting trace of the symmetric spiral inductor according to other embodiments of the present invention.
Figure 8B:
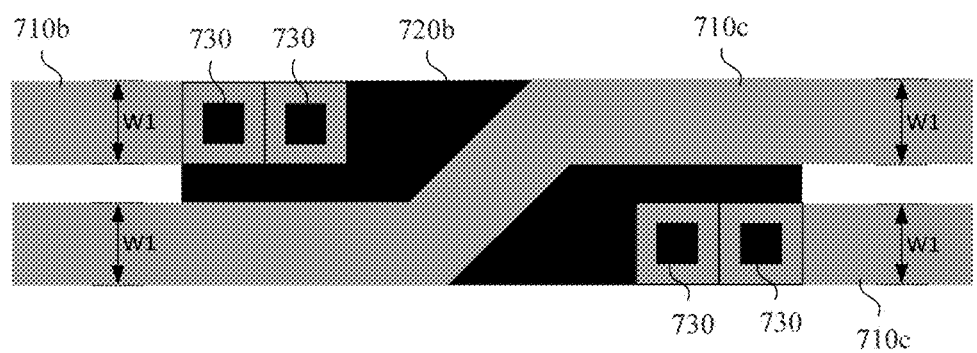

FIGS. 7A and 7B illustrate a structure of a symmetric spiral inductor and its partial enlargement according to another embodiment of the present invention. The symmetric spiral inductor 700 includes a plurality of metal traces 710 (710a~710d), a plurality of connecting traces 720 (720a~720c), and a plurality of connecting structures 730. The connecting trace 720 is made of metal. FIG. 7B is a partial enlargement of the enclosed region in FIG. 7A. When the metal trace 710 is made of the ultra thick metal (UTM) and the connecting trace 720 is made of the re-distribution layer (RDL), the large resistance of the connecting trace 720 may decrease the inductor's quality factor Q because the resistance of the RDL is higher than that of the UTM. In order to prevent the quality factor Q from decreasing, the area of the connecting trace 720 is increased in this embodiment to reduce its sheet resistance. The width at the connecting area 740 of the connecting trace 720 is maintained W, but the width of the connecting trace 720b is designed greater than W. Further, the width at the central part of the connecting trace 720b is W3, which is much larger than W, and thus the sheet resistance of the connecting trace 720b can be effectively reduced. In other embodiments, as shown in FIG. 8A, the area of the connecting trace 720b can be increased to further reduce its sheet resistance. Alternatively, as shown in FIG. 8B, the number of connecting structure 730 is increased to reduce the parasitic resistance of the connecting structure 730, and the area of the connecting trace 720b is also increased to obtain a better result.

Figure 9A:
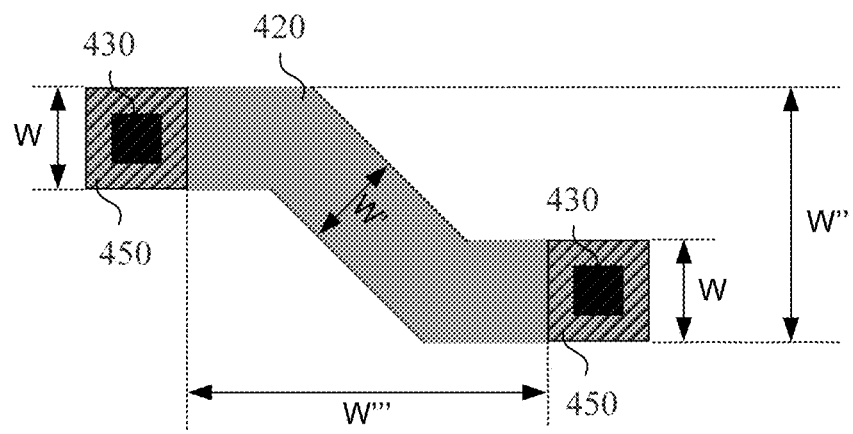
FIGS. 9A to 9D illustrate structures of connecting traces of the prior art and the present invention.
Figure 9B:
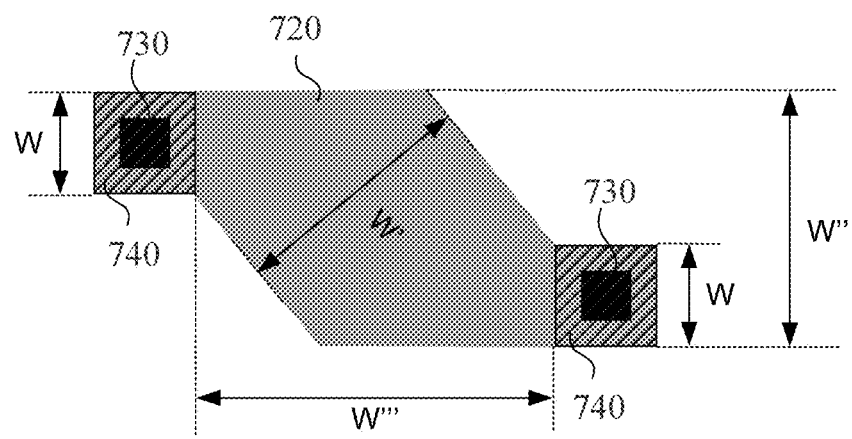
Figure 9C:
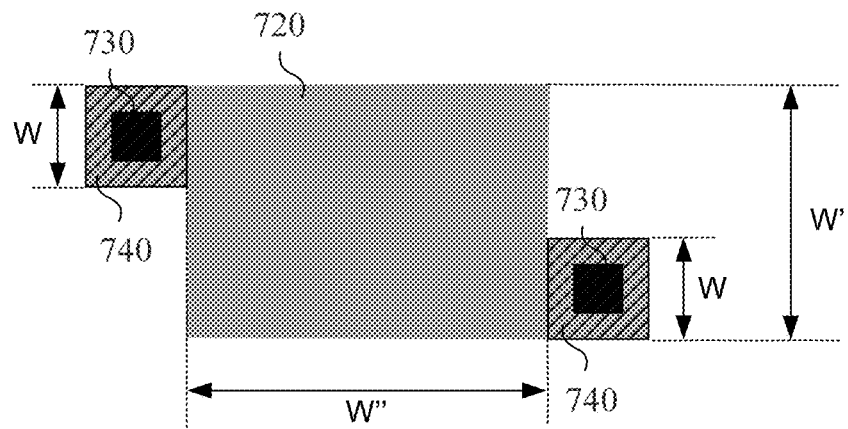
Figure 9D:
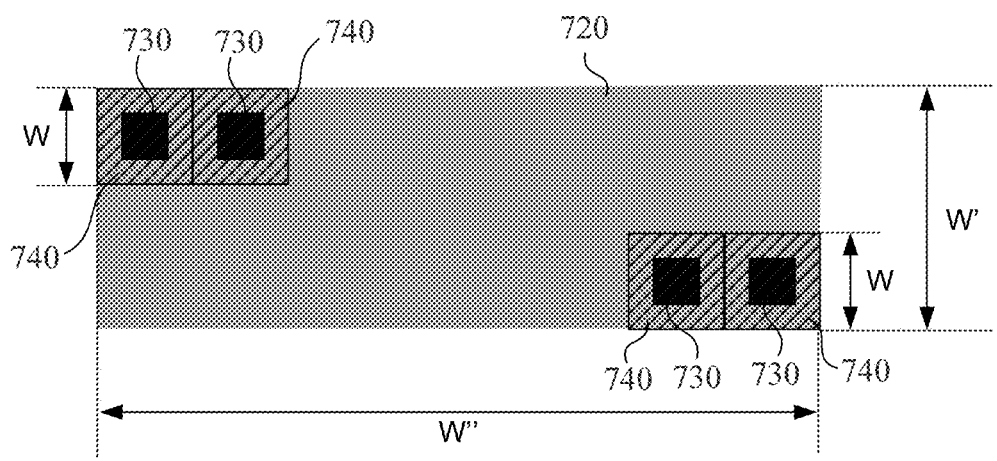

FIGS. 9A to 9D illustrate structures of connecting traces of the prior art and the present invention. FIG. 9A shows a structure of a prior-art connecting trace 420. The connecting trace 420 includes two connecting areas 450 (stripped region) that are connected to the connecting structure 430. The connecting area 450 of the connecting trace 420 is also restricted by the IC design rule, and its width should not be smaller than W=D+2h (assuming also that the permitted minimum width of the connecting structure 430 is D and the permitted minimum distance between the connecting structure 430 and the edges of the connecting trace 420 is h). According to different measuring manners, several widths can be obtained for the connecting trace 420 (except for the connecting area 450). These widths are a width W' at the central segment, a longitudinal width W'' and a lateral width W'''. The width W' at the central segment is the smallest among the 3 widths. In the prior-art connecting trace 420, the smallest width W' is designed to be the lower limit W, which causes an increase to the sheet resistance. The connecting trace 720 (except for the connecting area 740) in FIG. 9B has 3 widths W', W'' and W''', among which the width W' is the smallest but is apparently much larger than W. In comparison with FIG. 9A, the width W' at the central segment of the connecting trace 720 is larger than the width at the central segment of the connecting trace 420. An increase in the width of the connecting trace 720 reduces the sheet resistance, and therefore the integrated inductor can have a better quality factor Q. Likewise, in FIGS. 9C and 9D, the widths W' and W'' of the connecting trace 720 (except for the connecting area 740) are larger than W, and therefore the sheet resistance can be reduced.

Figure 10A:
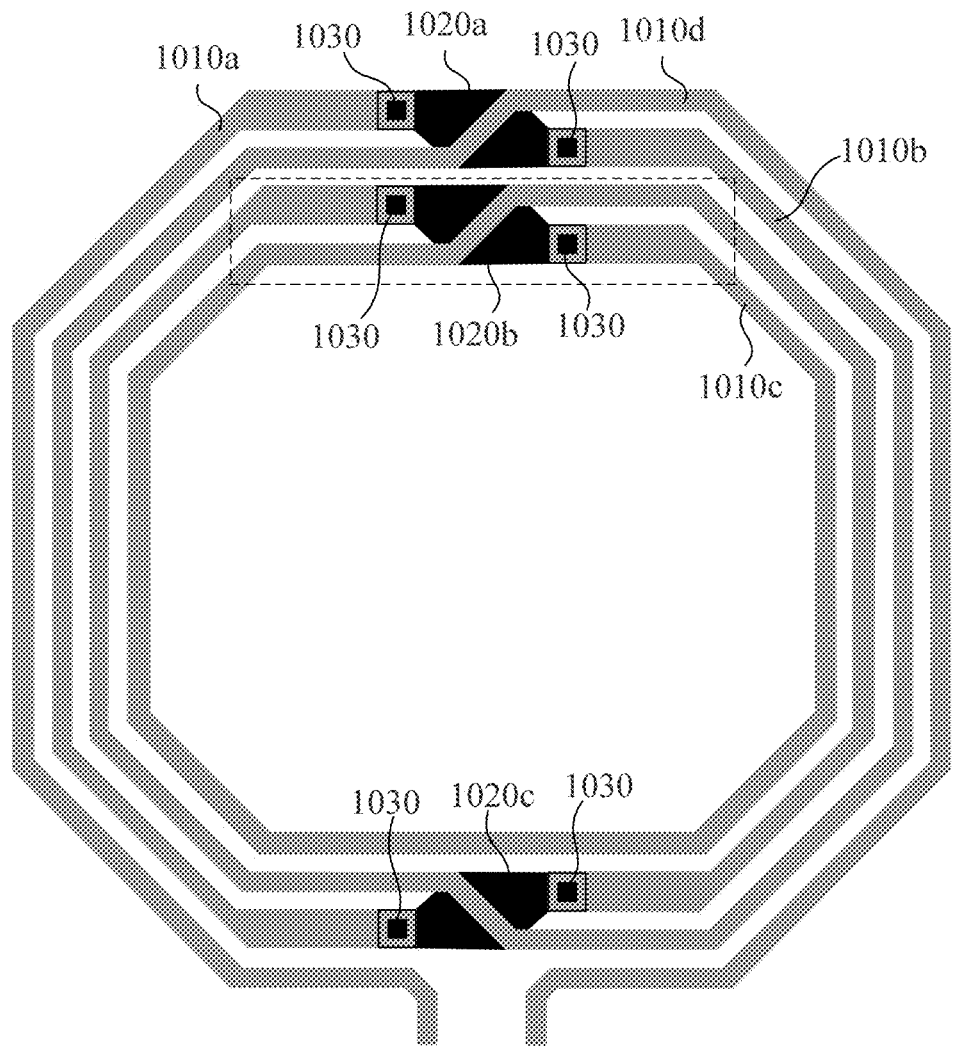
FIGS. 10A and 10B illustrate a structure of a symmetric spiral inductor and its partial enlargement according to another embodiment of the present invention.
Figure 10B:
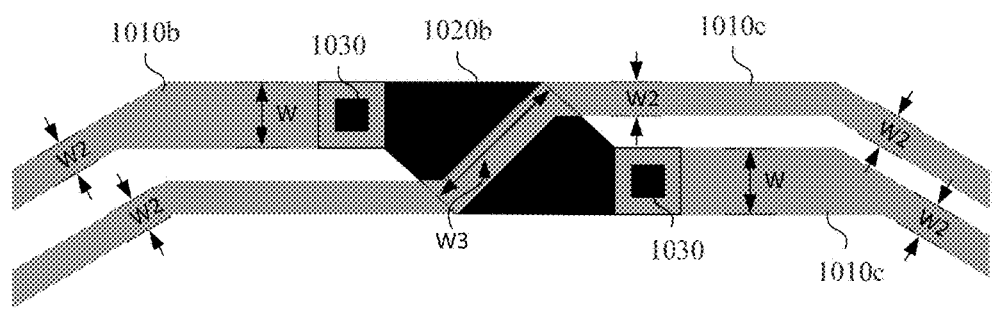

FIGS. 10A and 10B show a structure of a symmetric spiral inductor and its partial enlargement according to another embodiment of the present invention. The symmetric spiral inductor 1000 includes a plurality of metal traces 1010 (1010a~1010d), a plurality of connecting traces 1020 (1020a~1020c), and a plurality of connecting structures 1030. The connecting trace 1020 is made of metal. FIG. 10B is a partial enlargement of the enclosed region in FIG. 10A. The embodiment in FIG. 10A is a combination of the embodiments in FIGS. 5A and 7A; that is to say, any metal trace 1010 of the symmetric spiral inductor 1000 in FIG. 10A includes segments that are connected to the connecting structures 1030 and are designed to be wider to meet the restrictions of the IC design rule, and other segments that are designed to be narrower than the aforementioned segments to reduce the overall area of the symmetric spiral inductor 1000. Further, the smallest width of the connecting trace 1020 (except for the connecting area) is larger than the width of the connecting area. As shown in FIG. 10B, the widths of the segments of the metal trace 1010b and the metal trace 1010c that are connected to the connecting structures 1030 are W, and parts of the connecting trace 1020b that are connected to the connecting structure 1030 also have a width W. The widths of the segments of the metal trace 1010b and the metal trace 1010c that are not connected to the connecting structure 1030 are W2, which is smaller than W. A part of the connecting trace 1020b that is not connected to the connecting structure 1030 has a width larger than W; for example, the width at the central segment of the connecting trace 1020b is W3, which is larger than W. The symmetric spiral inductor 1000 has the advantages of the symmetric spiral inductor 500 and the symmetric spiral inductor 700 that the overall area of the integrated inductor is reduced to decrease the parasitic capacitance, and the sheet resistance of the connecting trace 1020 is also reduced. Referring to FIGS. 6A and 6B again, although the self-resonant frequency of the symmetric spiral inductor 1000 is close to that of the symmetric spiral inductor 500, the peak value of the quality factor Q of the symmetric spiral inductor 1000 is higher than that of the symmetric spiral inductor 500. Therefore, when the symmetric spiral inductor 1000 operates at a frequency where the inductance is relatively stable (around 3.5 GHz), a better quality factor Q can be assured.

Figure 11:
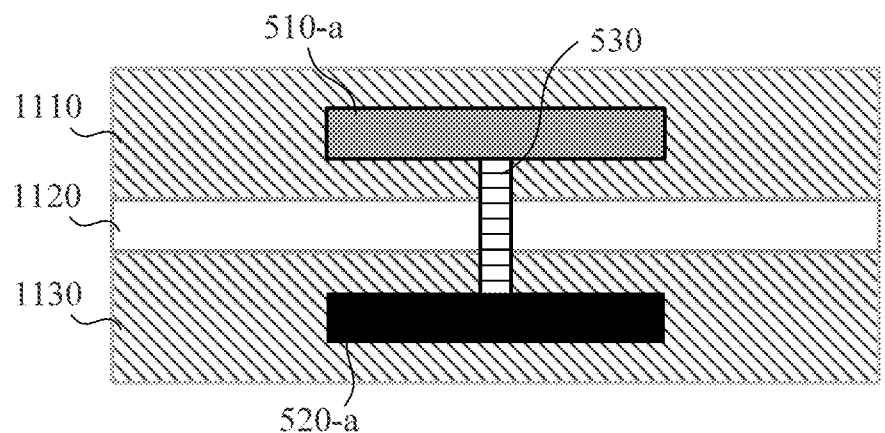
FIG. 11 illustrates a cross section of a metal trace, a connecting trace and a connecting structure according to one embodiment of the present invention.

The connecting structure 530, the connecting structure 730 and the connecting structure 1030 of this invention can be implemented by a via structure. Taking the metal trace 510a, the connecting trace 520a, and the connecting structure 530 in FIG. 5 as an example, a cross section of one of the implemented structures is shown in FIG. 11. The structure in FIG. 11 includes, from top to bottom, an oxide layer (or dielectric layer) 1110, a substrate 1120, and an oxide layer 1130. The metal trace 510a is contained in the oxide layer 1110, and the connecting trace 520a is contained in the oxide layer 1130. The connecting structure 530 penetrates through the oxide layer 1110, the substrate 1120, and the oxide layer 1130 so that the metal trace 510a and the connecting trace 520a, which are deployed at different layers, are connected to each other. This connecting structure 530 is referred to as a through silicon via (TSV).

The disclosed octagonal integrated inductor serves as merely an example; this invention can be applied to integrated inductors in other shapes. In addition, the connecting traces are arranged under the metal traces in this disclosure; however, the connecting traces can also be arranged above the metal traces. The shape, size, and ratio of any element in the disclosed figures are just exemplary for understanding, not for limiting the scope of this disclosure. Besides, each aforementioned embodiment may include one or more features; however, this doesn't mean that one carrying out the present disclosure should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present disclosure.

The aforementioned descriptions represent merely the embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An integrated inductor structure, comprising:
a first metal trace, having two ends respectively formed with a first connecting area and a second connecting area, wherein the first connecting area and the second connecting area respectively encompass at least one connecting structure;
a second metal trace; and
a connecting metal trace, connected directly with the first connecting area or the second connecting area and connecting the first metal trace and the second metal trace;
wherein the first metal trace, the connecting metal trace, and the second metal trace are connected to form an inductor structure, the first connecting area of the first metal trace has a first width, a smallest width of the first metal trace is a second width, and the second width is smaller than the first width;
wherein the first metal trace further has a third width which is greater than the second width and smaller than the first width.

2. The integrated inductor structure of claim 1, wherein the connecting structure connects a connecting area of the connecting metal trace, the connecting area of the connecting metal trace has the first width, a minimum width of the connecting metal trace, except for the connecting area, is a third width, and the third width is larger than the first width.

3. The integrated inductor structure of claim 1, wherein the connecting structure connects a connecting area of the second metal trace, the connecting area of the second metal trace has the first width, a smallest width of the second metal trace is a fourth width, and the fourth width is smaller than the first width.

4. The integrated inductor structure of claim 3, wherein the second width is equal to the fourth width.

5. The integrated inductor structure of claim 4, wherein the connecting structure connects a connecting area of the connecting metal trace, the connecting area of the connecting metal trace has the first width, a minimum width of the connecting metal trace, except for the connecting area, is a third width, and the third width is larger than the first width.

6. The integrated inductor structure of claim 1, wherein the first metal trace comprises a first segment and a second segment, a width of the first segment is the second width, the second segment is an extension of the first segment and comprises the first connecting area or the second connecting area, and a width of the second segment is larger than the second width.

7. The integrated inductor structure of claim 1, wherein the first metal trace and the second metal trace are arranged at the same layer in the structure, the connecting metal trace is arranged at a layer different from the layer of the first metal trace and the second metal trace, and the connecting structure is either a via that penetrates a dielectric layer or a TSV that penetrates silicon.

8. The integrated inductor structure of claim 1, wherein the connecting metal trace connects the first metal trace or the second metal trace through a plurality of connecting structures.

9. The integrated inductor structure of claim 1 being a structure of a symmetric spiral inductor.

* * * * *